United States Patent [19]

Hug

[11] Patent Number: 5,530,539
[45] Date of Patent: Jun. 25, 1996

[54] APPARATUS FOR MEASURING THE TRANSIT TIME OF ELECTROMAGNETIC WAVES

[75] Inventor: Gottfried Hug, Waldkrich, Germany

[73] Assignee: Erwin Sick GmbH, Optik-Elektronik, Waldkrich/Breisgau, Germany

[21] Appl. No.: 194,949

[22] Filed: Feb. 10, 1994

[30] Foreign Application Priority Data

Feb. 12, 1993 [DE] Germany .................... 43 04 290.2

[51] Int. Cl.⁶ .............................. G01C 3/08; G01S 13/08
[52] U.S. Cl. .......................................... 356/5.07; 342/135
[58] Field of Search .................. 356/5.06, 5.07, 356/5.08; 342/135

[56] References Cited

U.S. PATENT DOCUMENTS

| | | |
|---|---|---|
| 3,503,680 | 3/1970 | Schenkerman . |
| 3,545,861 | 12/1970 | Farnsworth et al. . |
| 3,666,367 | 5/1972 | Farnsworth et al. . |
| 4,153,366 | 5/1979 | Mamon et al. . |
| 4,770,526 | 9/1988 | Manhart et al. . |
| 4,895,440 | 1/1990 | Cain et al. . |
| 5,102,219 | 4/1992 | Skagerlund . |

*Primary Examiner*—Stephen C. Buczinski
*Attorney, Agent, or Firm*—Townsend and Townsend and Crew

[57] ABSTRACT

An apparatus for measuring the transit time of electromagnetic waves operates with pulse frequencies (9, 10), conducted in a feedback loop (12) which are supplied after passing through a measurement path (13) or through a reference path (14) to a resonator (35). As a result of an 180° phase-shift of the last pulse (10) of each pulse sequence (9, 10) the resonator oscillation collapses abruptly at a specific point in time. The directly preceding zero passage of the resonator oscillation defines the time of reception of the pulse sequence.

10 Claims, 2 Drawing Sheets

APPARATUS FOR MEASURING THE TRANSIT TIME OF ELECTROMAGNETIC WAVES

BACKGROUND OF THE INVENTION

The invention relates to an apparatus for the measurement of the transit time of electromagnetic waves, in particular light waves.

In a known apparatus of this kind (German Patent 34 29 062) the individual pulses transmitted by the pulse generator are formed into a roof-like pulse with a clear peak and a differentiation of the pulse signal takes place in the pulse reception time detection circuit, whereupon a zero passage detection of the differentiated signal subsequently takes place. Through the differentiation of the pulse ramps there arises a positive and negative region in which noise signals of a signal are permitted and remain without consequences for signal processing. This region is however dependent on the signal and requires analog signal processing in the amplifier. Simple limiting amplifiers cannot be used here because a limitation of the signal would lead to the flank information being destroyed. As the integral of the permissible noise range is required, whereby an energetic coupling with the length of the measurement region arises, the energy of the transmitted pulse is only inadequately exploited.

SUMMARY OF THE INVENTION

It is an object of the invention to provide an apparatus of the initially named kind which is able to process very noisy signals or to filter out received signals from a noise spectrum.. Furthermore, the loss of information should be kept as small as possible at the interface between the analog and digital signal processing without subsequently overloading the digital system with information which would make both the layout of the interface and the subsequent processing system very expensive. Furthermore, the apparatus should be so laid out that it can be integrated into a digital one-chip solution.

Thus, in accordance with the invention, a single pulse is no longer generated but rather a short sequence of temporally consistent pulses, the amplitude and inter-pulse separation separately having a constant size so that the pulses in the short sequence repeat at a fixed frequency. A subsequent final pulse is characterised in that it has a phase shift of 180° relative to the preceding pulse sequence. If now the signal path is supplemented by the insertion of a resonant circuit of predetermined quality and that resonates at the fixed frequency then the signal energy is accumulated via the pulse sequence and is finally rapidly decimated by the final, out-of-phase pulse. The envelope of a signal train is of the form where the locking in phase describes an exponential function and then breaks off abruptly. This has the consequence, via the signal evaluation, that a zero passage detector which should be connected after the oscillating circuit now achieves a maximum of the statistical precision for the fixation of the time of the reception event through the accumulation of the signal energy at the end of the pulse sequence. This maximum of statistical reliability, the most probable time interval of the event is now marked by the final pulse in the envelope curve by a dynamic step.

The introduction of a refresh or recuperation time is important, because of the temporal length of the pulse sequences of the invention, when the measurement path of the reference path is so short that without the insertion of this delay time a further trigger signal will already be initiated before the last pulse of the pulse sequence has been transmitted.

In accordance with another aspect of the present invention the collapse of the envelope curve brings about a precise determination of the time of reception via the zero passage detection. The envelope curve detector thereby serves to mark that pulse which also permits the highest accuracy of determination even when the signals are noisy. After the collapse of the envelope curve no resetting of the time triggering initiated by the preceding zero passage thus takes place, whereby this zero passage determines the time.

The present invention resets a timing circuit into the initial state whenever a pulse exceeds $1/\sqrt{2}$ times the value of the preceding envelope. In this way the last sequence pulse prior to the final phase jump becomes the event which triggers the reception. This event coincides with the precision maximum in the event space.

The present invention makes it is possible to execute the particularly important one-chip solution. This embodiment thus ensures a precise time determination of the reception event at favourable manufacturing costs.

BRIEF DESCRIPTION OF THE DRAWINGS

The invention will be described in the following by way of example and with reference to the drawings.

In FIGS. 2 through 8 the abscissa is the time axis t.

DESCRIPTION OF THE PREFERRED EMBODIMENT

Figure 1:
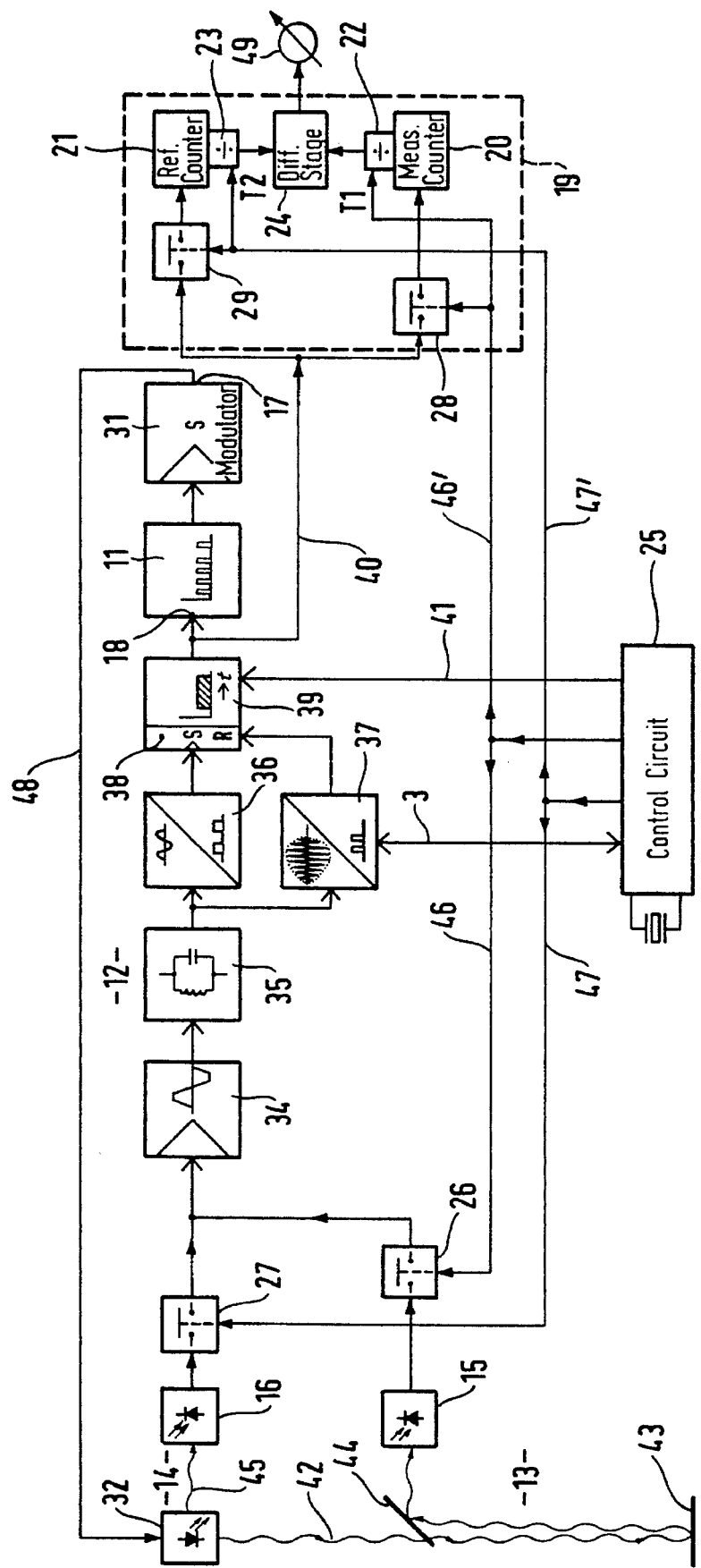
FIG. 1 is a block circuit diagram of an apparatus made in accordance with the invention for transit time measurement.

FIG. 1 shows a central time control circuit 25 connected via a first control line 41 to a refresh time circuit 39 the output of which is applied to the trigger input 18 of a pulse generator 11. On the arrival of a trigger signal, the pulse generator transmits a short sequence of pulses 9, 10 as reproduced in FIG. 2. The sequence of pulses consists of a pulse group 8 of eight equally spaced, equally long and equally high rectangular pulses 9 which are followed by a final pulse 10 at an interval increased by 180°.

Figure 2:
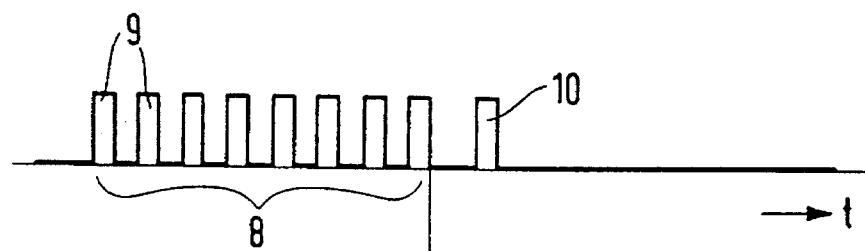
FIG. 2 shows the pulse sequence generated by the pulse generator of FIG. 1 after reception at the input of resonator.

The transmission of a short sequence of pulses 9, 10 in accordance with FIG. 2 is initiated at the trigger input 18 of the pulse generator 11 through a start signal in the form of an individual pulse from the time control circuit 25. In an attached modulator 31 the generated pulses are converted into corresponding light pulses. The output of the modulator 31 is connected via a line 48 to a light transmitter 32, which, for example, can be a semiconductor transmitter diode.

A portion of a directed along light wave 42 emerging from the transmitter 32 is a measurement path 13 to a reflector 43 at one end of the path. The other end of measurement path 13 is formed by a beam splitter 44 through which light from light transmitter 32 passes and which reflects light from reflector 43 to a measurement receiver 15 formed as a pin diode.

Another portion 45 of the emerging from light transmitter 32 is directed via a reference path 14, which is made as short as possible, to a reference receiver 16 formed as a Pin diode.

To the extent possible the spacing between the transmitter 32 and the reference receiver 16 should be the same as between the transmitter 32 and the beam splitter 44. Any difference in the spacings can be taken into account later during the computational evaluation discussed below.

Respective electronic switches 26 and 27 are connected after the measurement receiver and the reference receiver 15 and 16 respectively and are controlled via further control lines 46, 47 from the time control circuit 25.

The outputs of the switches 26, 27 are applied to the input of an amplitude limiter 34 which is followed by a resonator 35 tuned to the frequency of the pulse group 8. A reception preamplifier can also be provided in the amplitude limiter 34 for amplifying the input signal to improve the signal to noise ratio for the signal transmission to the actual limiter stage.

The amplitude limiter 34 has a deadtime free signal restricting behaviour. It matches the subsequent circuit stages to the required signal input dynamic. Through an initial high amplification which is reduced strongly to a limitation level by the amplitude limiter 34 the characteristics of a very much more expensive regulating amplifier are substituted for the signal requirements which prevail here.

The flank distortions caused by the principle are removed by the fulfilment of the symmetry by the subsequent resonator 35 whereby a cost favourable integration of the limiter 34 is made possible. It can be realised by simple negative feedback inverters which can be equipped, because of the high working frequencies, with decoupling capacitors capable of integration.

The resonator 35 is the single component of feedback loop 12 which is not integrated into one and the same semiconductor component chip consists of a simple LC circuit which follows the amplitude limiter 34. The resonator 35 serves for the described removal of distortion at the limiter and for effective signal filtering.

Figure 3:
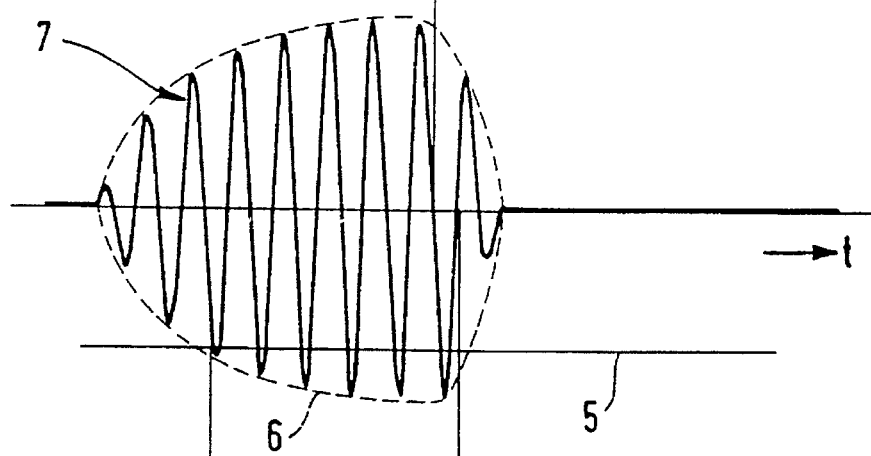
FIG. 3 shows the resonant oscillation which arises in the resonator of FIG. 1.
Figure 4:
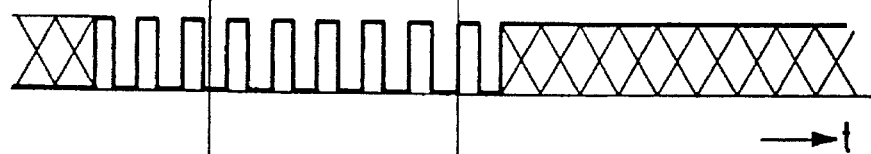
FIG. 4 is the output signal of a zero passage detector.

The oscillating signal present at the output of the resonator 35 is illustrated in FIG. 3. The signal energy is accumulated over the pulse sequence through the matching of the resonator 35 to the frequency of the pulse group 8 consisting of the pulses 9. The final pulse 10, shifted by 180°, rapidly terminates the resonator oscillation. A zero passage detector 36 and an envelope curve detector 37 are connected in parallel to the resonator 35.

The zero passage detector 36 satisfies the symmetry condition, for a static evaluation of a time jitter. It is so connected that it triggers a subsequently provided pretrigger 38 with each corresponding zero passage in dependence on the sign.

The output of the envelope curve detector 37 is connected to the resetting input R of the pretrigger 38, with the output of the zero passage detector 36 being applied to the setting input S of the pretrigger. The envelope curve detector 37 delivers information concerning the quality of the detection (number and distribution of the pulses) via a bidirectional connection line 3 to the time control circuit 25 so that the latter can regulate the response threshold via a desired value/actual value comparison (digital counting process). In this way an automatic matching takes place in simple manner to the resonator level and to its input signal.

The pretrigger 38 is followed by a refresh time circuit 39 which takes care of the required recuperation time for all transient processes. A digital realisation using an asynchronous, clock independent, start-stop generator (ring oscillator) with a short counter chain satisfies this requirement.

The output of the refresh time circuit 39 is applied to the trigger input 18 of the pulse generator 11. In this manner a feedback circuit 12 is closed.

All pulses 9 are preferably built up symmetrically with respect to their base width and the pause time lying therebetween, with the exception of the 180° phase-shifted pulse 10. In this way the exploitable fundamental wave component is increased and the harmonic component is restricted. Thus the pulse width is also preset by the resonator frequency for which values of 10 MHz to 1 GHz can be considered, however operation should not take place substantially over 100 MHz for economic reasons. The associated pulse times can thus amount to 0.5 ns to 50 ns.

The manner of operation of the described circuit will now be described in the following with reference to the diagrams of FIGS. 2 to 8.

The pulse sequence of FIG. 2 has the consequence of an oscillation 7 in the resonator 35 in accordance with FIG. 3 which simultaneously defines an envelope curve 6. In the zero passage detector 36 a pulse is set for each rising zero passage of the oscillation 7 and is reset for each falling zero passage, so that a pulse sequence arises as is reproduced in FIG. 4.

The detection quality of the preceding cycle is in each case stored in the time control circuit 25. Thus, only the result of the detection of this envelope curve 6 but not the envelope curve itself is stored. As this evaluation takes place by counting of the switching pulses of the envelope curve detector and by comparison with a preset desired value of n pulses (in FIG. 3 there are six pulses) a resetting of the detection threshold 5 is achieved on a deviation of the actual pulse time and thereby an automatic level adaptation is brought about.

If, for example, only five pulses are counted instead of the six pulses of FIG. 3 then the threshold 5 must be corrected downwardly. For seven pulses it would be too low and must be corrected upwardly. This is done by a three point regulator with three output states. The threshold 5 is set at the correct level when, in accordance with FIG. 3, six pulses are counted. Here the detection quality is ideal, no correction takes place. If the pulse number differs then the quality is not satisfactory and a correction takes place. During this the detection quality of the preceding cycle determines the threshold setting for the next cycle. The storing of the result of the detection, i.e. of the detection quality takes place digitally by recording the deviation and the output takes place time proportionally by positive or negative current pulses which—fed into an analog capacitor—represent the threshold level. This function is associated with the time control circuit 25 through the digital storage and the subsequent time proportional transmission of n pulses.

The threshold 5 as shown in FIG. 3 corresponds to 1/$\sqrt{2}$ times the maximum of the preceding envelope curve 6. The envelope curve detector 37 is now so laid out that it always transmits a pulse to the reset input of the pretrigger 38 when, and so long as, the resonator oscillation of FIG. 3 falls short of the threshold 5. Thus, on the whole, a pulse sequence in accordance with FIG. 5 arises at the output of the envelope curve detector 37.

Figure 5:
FIG. 5 is the output signal of a envelope curve detector.
Figure 6:
FIG. 6 is the output signal of a pretrigger.

Whereas the rising flanks of the pulses transmitted from the zero passage detector 36 to the setting input S of the pretrigger 38 (FIG. 4) set the pretrigger 38, it is reset by the rising flanks of the envelope curve pulses of FIG. 5. Accordingly a pulse sequence arises at the output of the pretrigger 38 as is reproduced in FIG. 6. One recognises that the rising flank 4 of the last setting process of the pretrigger 38 can be used as a measure for the event, i.e. for the arrival of the pulse sequence, because this time is very accurately determined and is largely free of noise effects.

Figure 7:
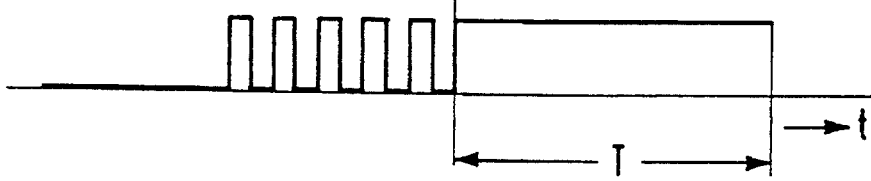
FIG. 7 is the output signal of a refresh time circuit.
Figure 8:
FIG. 8 is the trigger signal at a trigger input of the pulse generator.

In the subsequent refresh time circuit 39 a constant delay time T is introduced in accordance with FIG. 7 after which the signal which was constant at this point drops off to zero and a trigger pulse flank 2 is generated in accordance with FIG. 8 which triggers the next sequence of pulses 9, 10 in accordance with FIG. 2 at the trigger input 18 of the pulse generator 11.

The delay time T is so selected that the correct recovery time for all transient processes is present. Through the introduction of the delay time T the non-negligible temporal length of the pulse sequence 9, 10 is also taken into account. As can be seen from a comparison of the diagrams of FIGS. 2 and 6 the flank 4 of the pulse train of FIG. 6 which determines the event can occur already before the final pulse 10 of the pulse sequence 9, 10 is transmitted. In order to be certain, for shorter measurement and reference paths 13 and 14 respectively, that a new pulse sequence in the pulse generator 11 is first triggered after the full dying away of the preceding transmission procedure in the pulse generator 11, a correspondingly selected constant delay time T (FIG. 7) is added after the flank 4 which indicates the event exactly in accordance with FIG. 6. The flank 4 can, as already indicated, appear with a short path prior to the transmission of the final pulse 10. The trigger pulse flank 2 is thus formed at the end of the delay time T. The time T can be fixedly preset depending on the prevailing measurement problem. If, for example, only longer measurement paths 13 are used, and if the reference path 14 is also adequately long, then the delay time T can be set to a relatively short value and can indeed be avoided altogether. For short measurement and reference paths T must however be selected to be correspondingly longer. A digital realisation using an asynchronous, clock independent, start-stop generator (ring oscillator) with a short counter chain satisfies this requirement.

A line 40 leads from the output of the refresh time circuit 39 to a computing-counting stage 19 which contains two electronic switches 28 and 29 respectively which are controlled via control lines 46', 47' respectively from the time control circuit 25 in the same manner as the electronic switches 26 and 27 respectively.

A measurement counter 20 and a reference counter 21 are respectively connected to the outputs of the switches 28, 29. The summated counts are applied to dividing stages 22, 23 to which an input signal representative for the measurement time interval T1 and for the reference time interval T2 are respectively supplied as further input signals. The outputs of the dividing stages 22, 23 are applied to a difference forming stage 24 to the output of which a display device 49 is connected which displays the transit time of the pulses via the measurement path 13.

Apart from the considerable restriction of the noise bandwidth and thus a further increase of the detectability, the manner of operation of the apparatus described with respect to FIG. 1 is the same as that in accordance with the patent specification 34 29 062, and indeed in particular with regard to the evaluation of the transit time measurements described there. The switching stages 34 to 39 and 11, 13 formed in accordance with the invention and the enlarged functions of the readjustment of the switching threshold in the circuit 25 can thus be advantageously combined with the remaining circuit parts already known from DE-PS 34 29 062, in particular with the circuit parts 15, 16, 19, 26, 27, 32 and 49.

The timewise synchronous coupling-in of the pulse generator to the refresh timer 39, which can be executed as a ring oscillator, permits a purely digital design of these part components. For this a state controlled logic module is suitable in just the same way as a code ROM.

The modulator 31 consists of an output stage with increased current carrying ability. Because of the purely digital, i.e. switched modulation one can turn here to a standard solution. Through a one chip solution, couplings via a separate supply feed with the sensitive input signal are avoidable.

As a result of the design of the invention it is possible to detect signals down to the noise equivalence. During this it is made possible for the superimposed noise signal to be subjected to a true statistic evaluation. The noise bandwidth is additionally strongly reduced by the resonator 35. Both lead to a significant increase of the detectivity of the system. At the same time the same resonator 35 however also serves for effective transit time equalisation of a now permitted integratable limiter in the signal amplifier tract. The zero passage detection also makes it possible to renounce customary comparators. These can also be substituted here with integratable limiters. In this way not only is the disturbing transit time dispersion reduced but moreover costs, space requirements and power loss are saved. This is made possible by the advantageous combination of the zero passage detection and the envelope detection. A key function is furthermore taken on by the resonator 35 in connection with the special layout of the transmitted signal which also permits an uncomplicated digital modulation of the transmitter. This digital, saturation resistant, design first makes it possible to use the good value for money integratable limiter 34 in the signal input part. The high degree of exploitation of the transmitted energy which is achieved by the good correlation of the transmitted and received spectrum increases the efficiency.

When using laser diodes as transmitter elements a so-called mode competition arises in connection with a pulse level control. This generates in turn a transit time fluctuation of some 100 ps. This effect, which is very disturbing for the attainment of a high reproduction accuracy, is here effectively reduced by the formation of an integral phase plot by means of the burst design at the transmitter side. One then obtains a phase rest comparable with the CW method.

An important advantage of the invention lies in the very good compatibility with digital integration techniques, whereby a high depth of integration with low system costs is possible.

The trigger pulses contain from the time of transmission up to the trigger initiation transit time components of the internal assemblies, of the external media-inherent transit time and moreover of noise dependent time fluctuations. The intern group transit time can be split up into the stationary component dependent transit time in the particular device and furthermore into a temperature and aging dependent transit time component. The latter component in particular makes the compensation or correction by a reference measurement with a short circuited measurement path necessary. The noise dependent fluctuation component can be counteracted with statistical methods with a large number of individual samples. Through these measures a considerable quality improvement of the results is possible. These are first meaningful in relation to the measurement path. A problem which must first be overcome is extremely high time resolution of a few pico seconds or below. For this purpose the basic principles are used, which are described in the patent specification 34 29 062.

The desired high time resolution is achieved by transformation of the time region by several orders of magnitude. During this a closed time chain is formed. A received signal which is burdened by the transmission signal with the transit time of all the mentioned time fractions triggers a time circuit which serves for a recovery time of all transients and in turn causes anew the transmission of the pulse sequence described further above. Through the very large number of time chain elements—also termed loop passes—which can amount to several thousand during an evaluation time interval, it is possible to effect a quantisation, by simple counting of the loop passes within a quartz-stable time period, or by counting of a time scale within a predetermined number n of loop passes. The system inherent group transit time is to be subtracted from the total measurement time.

The computing counting stage 19 which is illustrated and described can be simplified as follows:

After the transit time formation with the method of the invention the time requirement for the reference measurement $t_r$ is subtracted from the time requirement for the total measurement $t_g$ for a constant number of n loop passes, with the total measurement time $t_g$ additionally containing the transit time $t_m$ of the measurement path. There results therefore the following relationship:

$$t_m = t_g - t_r$$

This takes place in the simplest case in an arrangement with a forward-backward counter which replaces the counters 20, 21. It is possible to dispense with the two dividing stages 22, 23. The change-over switches 28, 29 are replaced by a change-over control circuit which determines the respective counting direction. During this the time scale is first clocked in while rising over the entire measurement time and the reference measurement time is then clocked out in falling manner with the same time scale. The result of the transit time from the measurement path multiplied by the time transformation factor is now present in the counter. This result is directly proportional to the measurement path. It is free of the group transit time and of their drift components and it has been worked up statistically under the square root of the transformation factor which, for example at the factor 10K, makes it possible to obtain a result which is more stable by the factor 100. A calibration in mm, cm or inches is directly possible through the choice of the quartz time base and by setting the number of loop passages n.

What is claimed is:

1. Apparatus for measuring the transit time of electromagnetic waves, in particular of light waves, over a measurement path of predetermined length, said apparatus comprising:

an electrical pulse generator, having a trigger input coupled to receive a trigger signal and having an output, with the electrical pulse generator for generating a short sequence of pulses when the trigger signal is asserted, with the short sequence of electrical pulses comprising a fixed plurality of electrical pulses occurring at a fixed frequency and a last electrical pulse phase-shifted about 180° from a last electrical pulse in said plurality;

a feedback loop coupling the output and input of the pulse generator including:

a trigger signal generator, having an output, and having set and reset inputs, with said trigger signal generator for asserting a trigger signal when set;

a transmitter, coupled to receive the short sequence of electrical pulses generated by the electrical pulse generator, which transmits a light pulse in response to each electrical pulse in a received sequence to form short sequence of light pulses;

a reference receiver, disposed at the beginning of the measurement path, which receives a short sequence of light pulses at the beginning of the measurement path and converts them into a corresponding short sequence of electrical pulses;

a measurement receiver, disposed at the end of the measurement path, which receives the short sequence of light pulses and converts them into a corresponding short sequence of electrical pulses;

a switching circuit for selecting either said reference receiver or said measurement receiver as an included receiver in said feedback path to provide a selected corresponding short sequence of electrical pulses;

a resonator, coupled to receive the selected corresponding short sequence of electrical pulses, with said resonator tuned to said fixed frequency to output a resonator oscillation signal when excited by a plurality of electrical pulses in the selected corresponding short sequence of electrical pulses at said fixed frequency and with the resonator oscillation signal characterized by a rapid collapse when a last, out-of-phase shifted pulse in said selected short sequence of electrical pulses is received;

a time determination circuit, coupled to receive said resonator oscillation signal and having outputs coupled to the set and reset inputs of said trigger signal generating circuit, for resetting said trigger signal generating circuit in response to receiving said resonator oscillation signal and for responding to said rapid collapse to assert a timing signal indicating a time of receipt of said short sequence of electrical pulses to indicate the magnitude of a pulse transit time measured by said included receiver, with said timing signal for setting said trigger signal generator to output a trigger signal;

a refresh circuit, coupled to receive said trigger signal and coupled to the trigger input of said electrical pulse generator circuit, for triggering said electrical pulse generator a fixed time interval after said timing signal is asserted to prevent generating a second short sequence of electrical pulses before said electrical pulse generator has completed generating said short sequence of pulses; and a computing counting stage, coupled to receive said trigger signal and a series of clock pulses, for computing the transit time of said measurement path from the length of a measurement time interval and from the length of a reference time interval determined by the difference of the number of clock pulses counted between trigger signals.

2. Apparatus in accordance with claim 1, characterized in that the resonator oscillation signal has a plurality of zero passages and is bounded by an envelope curve, and where the time determination circuit further comprises:

a zero passage detector having an input coupled to receive said resonator oscillation signal and an output coupled to the set input of said trigger signal generator, said zero passage detector for asserting a setting signal in response to a zero passage directly preceding said rapid collapse of the resonator oscillation signal; and an envelope curve detector having an input coupled to receive said resonator oscillation signal and an output coupled to the reset input of said trigger signal generator, for asserting a resetting signal prior to said rapid collapse of said resonator oscillation signal.

3. Apparatus in accordance with claim 2, characterized in that the envelope curve detector transmits a resetting signal only when the resonator oscillation signal envelope curve exceeds a predetermined threshold fraction, of preferably $1/\sqrt{2}$ times a maximum of the envelope curve of the resonator oscillation signal of a preceding cycle; and a control circuit, coupled to said envelope curve detector, for determining said predetermined threshold fraction through a digital three-point regulation by means of counting of envelope curve pulses generated in response to zero passages.

4. Apparatus in accordance with claim 1, characterized in that said refresh time circuit is provided adjoining the trigger signal generator, and where the refresh time circuit delays the assertion of said trigger signal to the electrical pulse generator and to the computing counting stage by a fixed regeneration time.

5. Apparatus in accordance with claim 1, characterized in that the fixed regeneration time amounts to 2 to 200 ns, preferably 20 to 100 ns and in particular to two oscillation periods of the fixed frequency.

6. Apparatus in accordance with claim 1, characterized in that from 3 to 10, preferably from 5 to 9 and in particular 8 equally spaced pulses are provided in said fixed plurality of pulses before the preferably last pulse which is additionally phase-shifted by 180°.

7. Apparatus in accordance with claim 1, characterized in that an amplitude limiter is coupled to an input of the resonator.

8. Apparatus in accordance with claim 1, characterized in that the limiter, the zero passage detector, the envelope curve detector, the trigger signal generator, the refresh time circuit and the pulse generator are formed on a single semiconductor component chip.

9. Apparatus in accordance with claim 1, characterized in that the computing counting stage includes a forward-rearward counter at which the measurement time is first clocked in one counting direction and the reference time is then clocked out in the opposite counting direction.

10. Apparatus in accordance with claim 1, characterized in that the regeneration time (T) is selected to be sufficiently long that before the appearance of the trigger pulse flank the associated transmission process in the pulse generator has completely died away.

* * * * *

UNITED STATES PATENT AND TRADEMARK OFFICE
CERTIFICATE OF CORRECTION

PATENT NO. : 5,530,539
DATED : June 25, 1996
INVENTOR(S) : Gottfried Hug

It is certified that error appears in the above-indentified patent and that said Letters Patent is hereby corrected as shown below:

On the title page, item [75] Inventor: change "Waldkrich" to --Waldkirch--.

Signed and Sealed this

Twelfth Day of November, 1996

Attest:

BRUCE LEHMAN

Attesting Officer   Commissioner of Patents and Trademarks